US012635435B2

(12) United States Patent
Wang et al.

(10) Patent No.: US 12,635,435 B2
(45) Date of Patent: May 19, 2026

(54) RUTHENIUM CARBIDE FOR DRAM CAPACITOR MOLD PATTERNING

(71) Applicant: Applied Materials, Inc., Santa Clara, CA (US)

(72) Inventors: Han Wang, Sunnyvale, CA (US); Gene H. Lee, San Jose, CA (US); Yu Yang, Sunnyvale, CA (US); Jing Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 386 days.

(21) Appl. No.: 18/206,218

(22) Filed: Jun. 6, 2023

(65) Prior Publication Data

US 2023/0395391 A1 Dec. 7, 2023

Related U.S. Application Data

(60) Provisional application No. 63/349,355, filed on Jun. 6, 2022.

(51) Int. Cl.
H10P 50/00 (2026.01)
H10D 1/68 (2025.01)
H10P 50/28 (2026.01)

(52) U.S. Cl.
CPC .............. H10P 50/73 (2026.01); H10D 1/68 (2025.01); H10P 50/285 (2026.01)

(58) Field of Classification Search
CPC .................... H01L 21/31144; H01L 21/31122; H10D 1/68
See application file for complete search history.

(56) References Cited

U.S. PATENT DOCUMENTS

| | | | |
|---|---|---|---|
| 5,942,204 A | 8/1999 | Dunmead et al. | |
| 6,440,640 B1 | 8/2002 | Yang et al. | |
| 6,482,262 B1 | 11/2002 | Elers et al. | |
| 6,576,404 B2 | 6/2003 | Hu et al. | |
| 7,611,751 B2 | 11/2009 | Elers | |
| 7,666,474 B2 | 2/2010 | Li et al. | |
| 7,947,372 B2 | 5/2011 | Dekempeneer | |
| 9,624,577 B2 | 4/2017 | Manna et al. | |
| 11,183,398 B2 * | 11/2021 | Chen ................. | H01L 21/32139 |
| 2001/0009695 A1 | 7/2001 | Saanila et al. | |
| 2002/0042196 A1 | 4/2002 | Lee | |

(Continued)

FOREIGN PATENT DOCUMENTS

| | | |
|---|---|---|
| TW | 201807832 A | 3/2018 |
| WO | 2017052559 A1 | 3/2017 |

OTHER PUBLICATIONS

PCT International Search Report and Written Opinion in PCT/US2023/024525 dated Sep. 21, 2023, 11 pages.

*Primary Examiner* — Jay C Kim
*Assistant Examiner* — Woo K Lee
(74) *Attorney, Agent, or Firm* — SERVILLA WHITNEY LLC

(57) ABSTRACT

Methods of forming electronic devices and film stacks comprising depositing a ruthenium carbide hard mask on a capacitor mold formed on a substrate. A hard mask oxide and patterned photoresist are formed, and the pattern of the patterned photoresist are transferred into the ruthenium carbide hard mask. Film stacks comprising the ruthenium carbide hard mask on the capacitor mold are also described.

14 Claims, 2 Drawing Sheets

(56) References Cited

U.S. PATENT DOCUMENTS

| 2002/0159944 | A1 | 10/2002 | Smalley et al. |
|---|---|---|---|
| 2008/0020248 | A1 | 1/2008 | Sridhar et al. |
| 2008/0293249 | A1 | 11/2008 | Cho et al. |
| 2010/0055922 | A1 | 3/2010 | Kim et al. |
| 2014/0213059 | A1 | 7/2014 | Doan et al. |
| 2018/0315648 | A1 | 11/2018 | Ke et al. |
| 2019/0206681 | A1 | 7/2019 | De Silva et al. |
| 2019/0333807 | A1 | 10/2019 | Tung et al. |
| 2021/0313192 | A1 | 10/2021 | Joy et al. |
| 2021/0398983 | A1 | 12/2021 | Lee |
| 2022/0102143 | A1 | 3/2022 | Chen et al. |
| 2022/0375759 | A1* | 11/2022 | Kim ................... H01L 21/0332 |

* cited by examiner

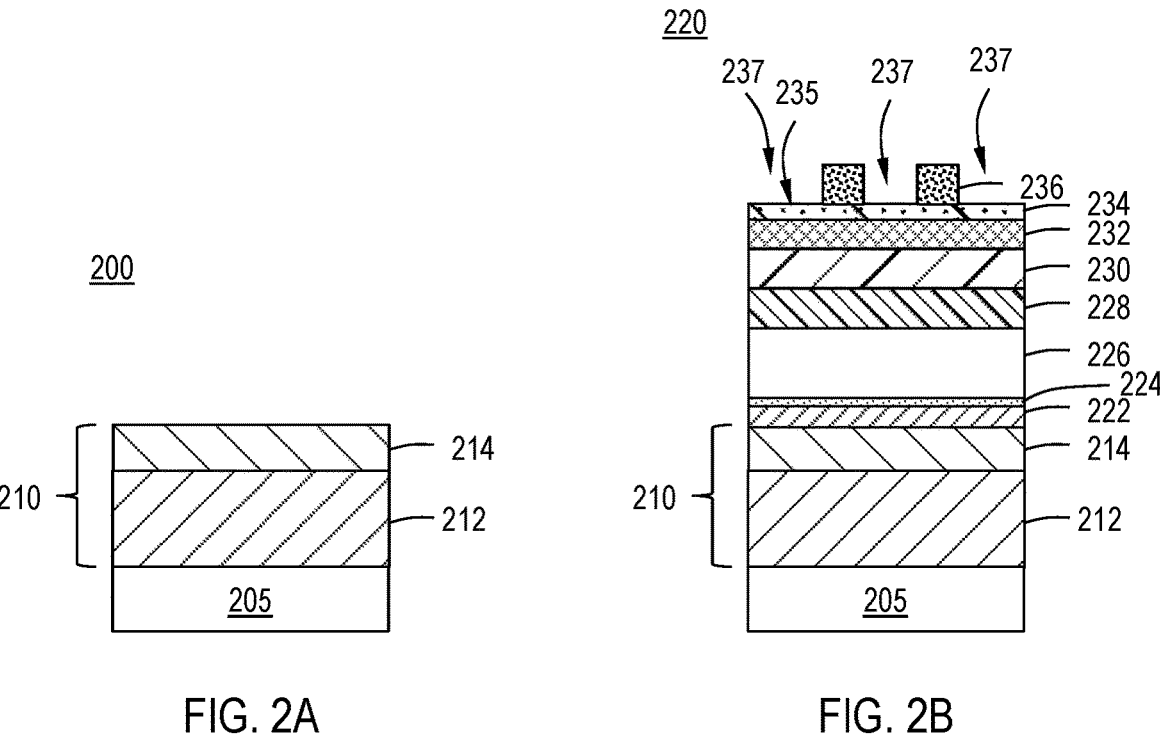
FIG. 2A
FIG. 2B
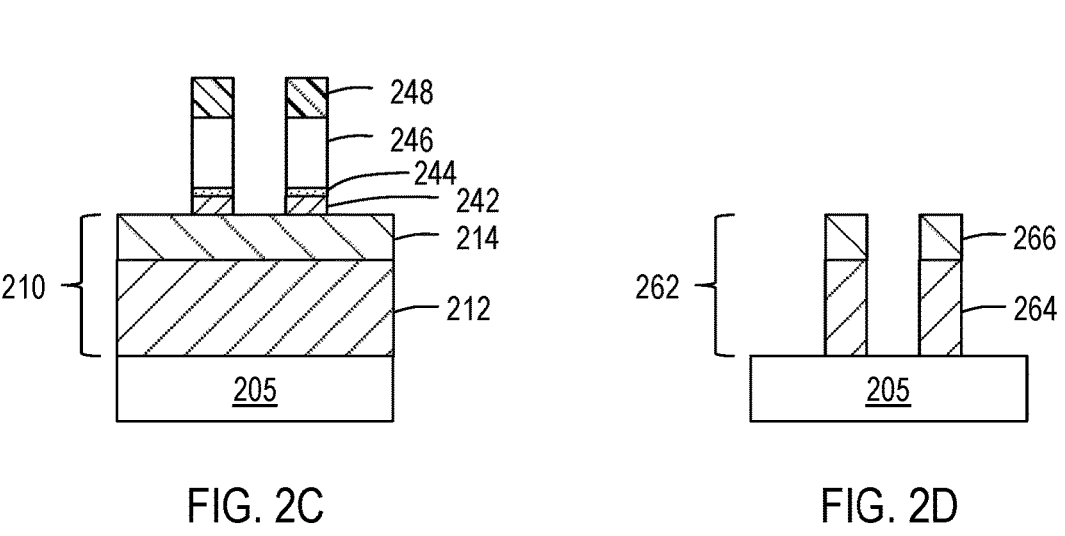
FIG. 2C
FIG. 2D

RUTHENIUM CARBIDE FOR DRAM CAPACITOR MOLD PATTERNING

CROSS-REFERENCE TO RELATED APPLICATIONS

This application claims priority to U.S. Provisional Application No. 63/349,355, filed Jun. 6, 2022, the entire disclosure of which is hereby incorporated by reference herein.

TECHNICAL FIELD

Embodiments of the disclosure generally relate to the fabrication of integrated circuits. In particular, embodiments of the disclosures are related to film stacks and methods of forming film stacks for electronic devices using a ruthenium carbide hard mask.

BACKGROUND

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The various semiconductor components (e.g., interconnects, vias, capacitors, transistors) require precise placement of high aspect ratio features. Reliable formation of these components is critical to further increases in device and density.

Additionally, the electronic device industry and the semiconductor industry continue to strive for larger production yields while increasing the uniformity of layers deposited on substrates having increasingly larger surface areas. These same factors in combination with new materials also provide higher integration of circuits per unit area on the substrate.

During formation of many electronic devices, hard masks are used to protect portions of a substrate from being removed. Hard masks are commonly used in patterning operations. Once patterning has been completed, the hard mask is frequently removed, leaving the protected portion of the substrate. Removal of the hard mask material may occur separately from or in conjunction with other etch processes. The ability to remove the hard mask material without affecting other surface features (also referred to as etch selectivity) is a useful feature.

The development of hard mask materials having high etch selectivity is important for patterning new generation NAND and DRAM devices. For devices at each technology node, a 30% selectivity improvement of the capacitor mold hard mask over previous nodes is needed. Currently, boron-doped silicon is used in DRAM capacitor mold patterning for the N to N+2 nodes.

As the N+2 node has been proposed, the dopant concentration is boron dominant. Therefore, increasing the boron dopant concentration is not likely to continue to improve the hard mask selectivity sufficiently.

Therefore, there is an ongoing need in the art for capacitor mold hard mask with improved selectivity.

SUMMARY

One or more embodiments of the disclosure are directed to methods comprising depositing a ruthenium carbide hard mask on a capacitor mold formed on a substrate. A hard mask oxide is formed on the ruthenium carbide layer. A patterned photoresist is formed on the hard mask oxide. The pattern of the patterned photoresist is transferred to the ruthenium carbide hard mask to form a patterned ruthenium carbide hard mask.

Additional embodiments of the disclosure are directed to methods comprising forming a capacitor mold on a substrate. The capacitor mold comprises a silicon oxide (SiO) layer and a silicon carbon nitride (SiCN) layer or silicon nitride (SiN) layer on the silicon oxide layer. The silicon oxide (SiO) layer has a thickness in the range of 1 μm to 3 μm and the SiCN layer or SiN layer having a thickness up to 1000 Å. One or more of an amorphous silicon film or carbon film is optionally deposited directly on the capacitor mold. A ruthenium carbide hard mask is deposited on the capacitor mold and on the optional amorphous silicon film or carbon film, if present. The ruthenium carbide hard mask comprises in the range of 20 to 45 at. % ruthenium and in the range of 5 to 15 at. % hydrogen. The sum of thicknesses of the optional amorphous silicon film or carbon film and the ruthenium carbide hard mask in the range of 2500 to 3500 Å. A hard mask oxide is formed on the ruthenium carbide layer. An anti-reflective coating comprising one or more of a dielectric anti-reflective coating (DARC) or bottom anti-reflective coating (BARC) is formed on the hard mask oxide. A photoresist having a pattern is formed on the anti-reflective coating. The pattern of the photoresist is transferred to the anti-reflective coating, the hard mask oxide and the ruthenium carbide hard mask by exposing the substrate to an etchant plasma comprising an oxygen content, a chlorine content and a carbonyl sulfide content to form a patterned hard mask oxide, a patterned ruthenium carbide hard mask and remove the anti-reflective coating. The chlorine content is in the range of 5% to 15% of the oxygen content, on a molar basis, the carbonyl sulfide content is in the range of 5% to 10% of the oxygen content, on a molar basis. Remaining photoresist and anti-reflective coating is removed to leave a patterned hard mask oxide and patterned ruthenium carbide hard mask. The pattern of the patterned hard mask oxide and patterned ruthenium carbide hard mask is optionally transferred into the optional amorphous silicon film or carbon film.

Further embodiments of the disclosure are directed to film stacks comprising: a capacitor mold; a ruthenium carbide hard mask on the capacitor mold; a hard mask oxide on the ruthenium carbide hard mask; and a patterned photoresist on the hard mask oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A through 2D illustrate a process flow of a method in accordance with one or more embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
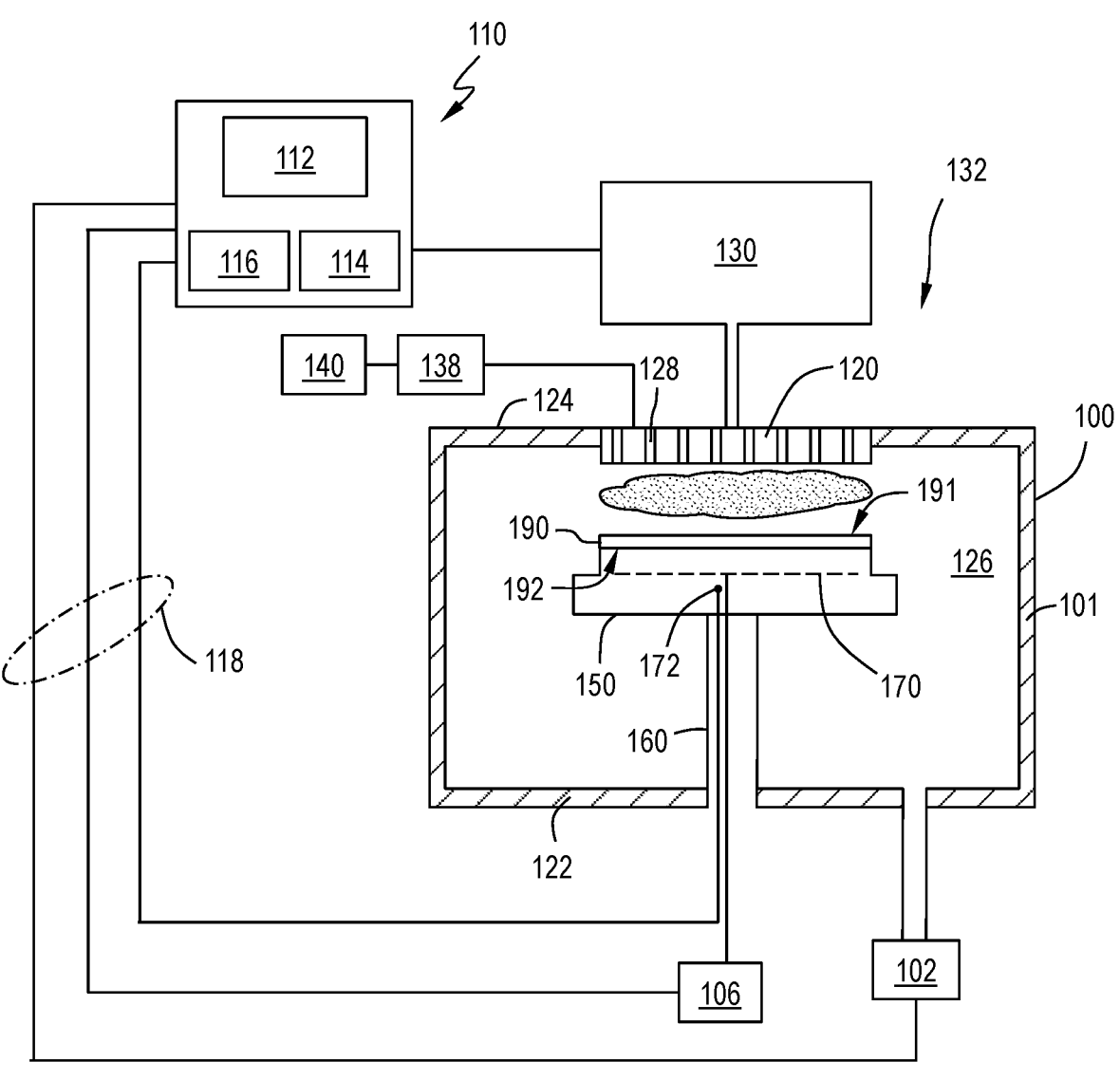
FIG. 1 illustrates a plasma process chamber for use with embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Some embodiments of the disclosure advantageously provide new hard mask materials with improved selectivity relative to boron-doped silicon. In some embodiments, a ruthenium carbide film is used as a hard mask that is selective relative to adjacent hard mask oxides and/or capacitor mold components. Some embodiments provide ruthenium carbide hard masks that can be ashed or etched from the substrate surface.

FIG. 1 is a schematic representation of an exemplary substrate processing system 132, which can be used for ruthenium carbide deposition, or other processes, according to embodiments described herein. Examples of suitable processing chambers and tools include, but are not limited to, the CENTURA® systems which may use a DxZ™ process chamber, PRECISION 5000® systems, PRODUCER™ systems, such as the PRODUCER SE™ process chamber and the PRODUCER GT™ process chamber, all of which are commercially available from Applied Materials, Inc., of Santa Clara, Calif. It is contemplated that the processes described herein may be performed on other substrate processing systems, including those from other manufacturers.

The substrate processing system 132 illustrated in FIG. 1, includes a process chamber 100 coupled to a gas panel 130 and a controller 110. The process chamber 100 generally includes a top 124, a side 101 and a bottom wall 122 that define an interior processing volume 126. A support pedestal 150 is provided in the interior processing volume 126 of the chamber 100. The pedestal 150 is supported by a stem 160 or pedestal support and may be typically fabricated from aluminum, ceramic, and other suitable materials. The pedestal 150 may be moved in a vertical direction inside the chamber 100 using a displacement mechanism (not shown) or rotated around a central axis of the stem 160 using a suitable rotary mechanism (not shown).

The pedestal 150 illustrated includes an embedded heating element 170 suitable for controlling the temperature of a substrate 190 supported on a surface 192 of the pedestal 150. The pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition. The supplied electric current may be adjusted to selectively control the temperature of the pedestal 150 between about 100° C. to about 700° C.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

A vacuum pump 102 is coupled to a port formed in the bottom of the chamber 100. The vacuum pump 102 is used to maintain a desired gas pressure in the process chamber 100. The vacuum pump 102 also evacuates post-processing gases and by-products of the process from the chamber 100.

The processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior processing volume 126 during process. A plasma is formed from the process gas mixture exiting the showerhead 120 to enhance thermal decomposition of the process gases resulting in the deposition of material on a surface 191 of the substrate 190.

The gas panel 130 may also be used to control and supply various vaporized liquid precursors. While not shown, liquid precursors from a liquid precursor supply may be vaporized, for example, by a liquid injection vaporizer, and delivered to the process chamber 100 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may form a pair of spaced apart electrodes in the interior processing volume 126. One or more RF power sources 140 provide a bias potential through a matching network 138 to the showerhead 120 to facilitate generation of plasma between the showerhead 120 and the pedestal 150. Alternatively, the RF power sources 140 and matching network 138 may be coupled to the showerhead 120, substrate pedestal 150, or coupled to both the showerhead 120 and the substrate pedestal 150, or coupled to an antenna (not shown) disposed exterior to the chamber 100. In one embodiment, the RF power sources 140 may provide between about 50 Watts and about 10,000 Watts at a frequency of about 50 kHz to about 100 MHz. In another embodiment, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, such as illustrated in FIG. 1.

Referring to FIGS. 2A-2D, an exemplary process for forming an electronic device is illustrated using a schematic cross-sectional representation of the electronic device. Shading illustrated in the Figures is used to show the different components and should not be taken as representing any particular material of construction unless specified.

FIG. 2A illustrates an electronic device 200 with a capacitor mold 210 formed on a substrate 205. The capacitor mold 210 of some embodiments comprises one or more of silicon oxide (SiO), silicon carbide (SiC), or silicon carbon nitride (SiCN). As used in this specification and the appended claims, unless otherwise specified, chemical formulae are merely representative of the elemental identities of the film and are not intended to be stoichiometric. For example, a SiO film comprises silicon and oxygen atoms. The typical silicon oxide film comprises primarily silicon dioxide ($SiO_2$), which implies a particular stoichiometric relationship. In some embodiments, the elemental formula of a layer means that the layer is greater than or equal to about 95%, 98%, 99% or 99.5% of the stated elements, on an atomic basis. The skilled artisan will recognize that interlayer diffusion of atoms may unintentionally occur, affecting the overall composition of the stated layer. Thus, for example, in a silicon oxide (SiO) layer, the sum of silicon atoms and oxygen atoms make up greater than or equal to 95%, 98%, 99% or 99.5% of the total atoms in that layer, allowing for a small amount of contamination and interlayer diffusion atoms. Stated differently, the layer "consists essentially of" the stated elements, where consisting essentially of means that the stated elements make up greater than or equal to 95%, 98%, 99% or 99.5%, on an atomic basis. The term "consists essentially of" can be applied to any of the individual layer described herein and is not limited to the example of silicon oxide.

The capacitor mold 210 of some embodiments comprises a silicon oxide (SiO) layer 212 and a second layer 214 comprising one or more of a silicon carbon nitride (SiCN) layer or a silicon nitride (SiN) layer. The silicon oxide layer 212 of some embodiments has a thickness in the range of 0.5 $\mu m$ to 5 $\mu m$, or in the range of 1 $\mu m$ to 3 $\mu m$. In some embodiments, the silicon oxide layer 212 has a thickness up to 3.5 $\mu m$.

The second layer 214 of some embodiments comprises a silicon carbon nitride (SiCN) layer. In some embodiments, the second layer 214 comprises a silicon nitride (SiN) layer. The second layer 214, or SiCN layer or SiN layer has a thickness up to 10,000 Å, or 5,000 Å or 1,000 Å. In some embodiments, the second layer 214 has a thickness in the range of 100 Å to 1000 Å, or in the range of 500 Å to 900 Å.

The silicon oxide layer 212 and second layer 214 can be formed by any suitable technique known to the skilled artisan. For example, the layers can be formed by chemical vapor deposition (CVD), plasma-enhanced chemical vapor deposition (PECVD), atomic layer deposition (ALD), plasma-enhanced atomic layer deposition (PEALD), physical vapor deposition (PVD).

The substrate 205 and/or capacitor mold 210 of some embodiments has a substantially planar surface. Alternatively, the substrate 205 and/or capacitor mold 210 of some embodiments has patterned structures, a surface having trenches, holes, or vias formed therein. While the substrate 205 is illustrated as a single body, the skilled artisan will understand that the substrate may contain one or more material layers used in forming semiconductor devices such as metal contacts, trench isolations, gates, bit-lines, or any other interconnect features. The substrate 205 may comprise one or more metal layers, one or more dielectric materials, semiconductor material, and combinations thereof utilized to fabricate semiconductor devices. For example, the substrate 205 may include an oxide material, a nitride material, a polysilicon material, or the like, depending upon application. In one embodiment where a memory application is desired, the substrate 205 may include the silicon substrate material, an oxide material, and a nitride material, with or without polysilicon sandwiched in between.

In some embodiments, the substrate 205 includes a plurality of alternating oxide and nitride materials (i.e., oxide-nitride-oxide (ONO)) deposited on a surface of the substrate (not shown). In various embodiments, the substrate 205 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon. The substrate 205 may be any substrate or material surface upon which film processing is performed. For example, the substrate 205 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

FIG. 2B illustrates the electronic device 220 after formation of an optional hard mask underlayer 222 on the capacitor mold 210. The hard mask underlayer 222 of some embodiments comprises one or more of an amorphous silicon (a-Si) film or a carbon (C) film. In some embodiments, the hard mask underlayer 222 comprises an amorphous silicon film. In some embodiments, the hard mask underlayer 222 comprises a carbon film. The hard mask underlayer 222 of some embodiments is formed directly on the capacitor mold 210 without an intervening layer.

An optional seed layer 224 is illustrated as being formed on the hard mask underlayer 222. In some embodiments, the optional seed layer 224 is formed directly on the hard mask underlayer 222. In some embodiments, the optional seed layer 224 is formed directly on the capacitor mold 210 and the hard mask underlayer 222 is omitted. In one or more embodiments, the optional seed layer 224 comprises boron. In some embodiments, the optional seed layer 224 has a thickness up to 100 Å, or in the range of 10 Å to 100 Å, or in the range of 20 Å to 60 Å.

A ruthenium carbide hard mask 226 is formed on the capacitor mold 210. In the illustrated embodiment, the ruthenium carbide hard mask 226 is formed directly on the optional seed layer 224 on the hard mask underlayer 222. In some embodiments, the optional hard mask underlayer 222 and optional seed layer 224 are omitted and the ruthenium carbide hard mask 226 is formed directly on the capacitor mold 210. In some embodiments, the hard mask underlayer 222 is omitted and the ruthenium carbide hard mask 226 is formed directly on the optional seed layer 224 which is formed on capacitor mold 210.

The ruthenium carbide hard mask 226 can be an amorphous, semi-crystalline or crystalline material. The hard mask may also be referred to as a ruthenium doped carbon film. However, the skilled artisan will recognize the term ruthenium doped carbon film is interchangeable with ruthenium carbide film and may depend on the level of crystallinity of the material.

The ruthenium carbide hard mask 226 of some embodiments has a ruthenium composition in the range of 20 to 45 atomic percent ruthenium. In some embodiments, the composition of the ruthenium carbide hard mask 226 comprises in the range of greater than 0 to 50 at. % ruthenium, 5 to 50 at. % ruthenium, 10 to 45 at. % ruthenium, 20 to 45 at. % ruthenium, or in the range of 25 to 40 at. % ruthenium, or in the range of 30 to 35 at. % ruthenium.

The ruthenium carbide hard mask 226 of some embodiments has a hydrogen composition in the range of 2 to 20 atomic percent hydrogen. In some embodiments, the composition of the ruthenium carbide hard mask 226 comprises in the range of 5 to 15 at. % hydrogen, or in the range of 8 to 12 at. % hydrogen. In some embodiments, the composition of the ruthenium carbide hard mask 226 comprises less than or equal to 15 at. % hydrogen, less than or equal to 10 at. % hydrogen, or less than or equal to 5 at. % hydrogen.

In some embodiments, the ruthenium carbide hard mask 226 comprises in the range greater than 0 to 50 atomic percent ruthenium and less than or equal to 15 atomic percent hydrogen with the remainder being carbon. In some embodiments, the ruthenium carbide hard mask 226 comprises in the range 10 to 45 atomic percent ruthenium and less than or equal to 10 atomic percent hydrogen with the remainder being carbon. In some embodiments, the ruthenium carbide hard mask 226 comprises in the range 20 to 45 atomic percent ruthenium and 5 to 15 atomic percent hydrogen with the remainder being carbon. In some embodiments, the ruthenium carbide hard mask 226 comprises in the range of 20 to 45 atomic percent ruthenium and less than or equal to 15, 10 or 5 atomic percent hydrogen with the remainder being carbon.

The ruthenium carbide hard mask 226 of some embodiments has a thickness in the range of 500 Å to 4000 Å, or in the range of 1000 Å to 4000 Å, or in the range of 1500 Å to 3500 Å. In some embodiments, the thickness of the ruthenium carbide hard mask is in the range of 2500 Å to 3500 Å. In some embodiments, the optional hard mask underlayer 222 has a thickness in the range of 100 Å to 500 Å and the ruthenium carbide hard mask 226 has a thickness in the range of 2500 Å to 3400 Å. In some embodiments, the combination of the optional hard mask underlayer 222 and the ruthenium carbide hard mask 226 have a thickness in the range of 2500 Å to 3500 Å. In some embodiments, the thickness of the combination of the optional hard mask underlayer 222, the optional seed layer 224 and the ruthenium carbide hard mask 226 is in the range of 500 Å to 4000 Å.

In the illustrated embodiment, a hard mask oxide 228 is formed on the ruthenium carbide hard mask 226. The hard mask oxide 228 can be any suitable material known to the skilled artisan that is etch selective relative to the ruthenium carbide hard mask 226. The hard mask oxide 228 of some embodiments has a thickness in the range of 500 Å to 1500 Å.

In the illustrated embodiments, an advanced patterning film (APF) 230 is formed on the hard mask oxide 228. The advanced patterning film 230 of some embodiments comprises a carbon or diamond-like carbon film. In some embodiments, the advanced patterning film 230 has a thickness in the range of 500 Å to 1500 Å. In some embodiments, the advanced patterning film 230 has a thickness greater than 0 Å and less than or equal to 1500 Å, or 1000 Å.

A dielectric anti-reflective coating (DARC) 232 is formed on the advanced patterning film 230. The DARC 232 can be formed by any suitable technique known to the skilled artisan. The dielectric anti-reflective coating 232 of some embodiments comprises silicon oxynitride (SiON). In some embodiments, the DARC 232 has a thickness in the range of 250 Å to 500 Å. In some embodiments, the DARC 232 has thickness of greater than 0 Å and less than or equal to 500 Å.

A bottom anti-reflective coating (BARC) 234 is formed on the DARC 232. The BARC 234 can be formed by any suitable technique known to the skilled artisan. In some embodiments, the BARC 234 has a thickness in the range of 100 Å to 500 Å. In some embodiments, the BARC 234 has a thickness greater than 0 Å and less than or equal to 500 Å.

A photoresist 236 is formed on the BARC 234. The photoresist 236 can be deposited by any suitable technique known to the skilled artisan. The photoresist 236 is patterned by any suitable technique (e.g., lithography) to form a patterned photoresist and expose a top surface 235 of the BARC 234. In some embodiments, the photoresist 236 is an energy sensitive resist material that can be patterned by exposing the energy sensitive resist material to UV radiation through a patterning device, such as a mask (not shown), and subsequently developing the energy sensitive resist material in an appropriate developer. After the energy sensitive resist material has been developed, a defined pattern of through openings 237 is present in the photoresist 236.

FIG. 2C illustrates the electronic device 220 after the pattern of the photoresist 236 has been transferred to the anti-reflective coatings 232, 234, the advanced patterning film 230, the hard mask oxide 228 and the ruthenium carbide hard mask 226. Transferring the pattern of the photoresist

236 in some embodiments removes the photoresist 236, the BARC 234, the DARC 232, and the advanced patterning film 230, leaving a patterned hard mask oxide 248 and patterned ruthenium carbide hard mask 246. In the illustrated embodiments, the pattern transfer also forms a patterned hard mask underlayer 242 and patterned seed layer 244. In some embodiments, the optional hard mask underlayer 222 and optional seed layer 224 are present and are not patterned with the ruthenium carbide hard mask 226.

Pattern transfer in some embodiments occurs by exposing the substrate to an etchant plasma using the photoresist 236 as a mask. The etchant plasma of some embodiments comprises an oxygen ($O_2$) content and a chlorine ($Cl_2$) content. The chlorine content of the etchant plasma of some embodiments is in the range of 5% to 15% of the oxygen content, on a molar basis. In some embodiments, the chlorine content of the etchant plasma is less than or equal to 15%, 10% or 5% of the oxygen content, on a molar basis.

In some embodiments, the etchant plasma comprises a carbonyl sulfide (COS) content. The COS content of some embodiments is in the range of 1% to 10% of the oxygen content, on a molar basis.

In some embodiments, the etchant plasma comprises oxygen, chlorine and carbonyl sulfide. The composition of the etchant plasma of some embodiments is 1-10% COS, 5-15% $Cl_2$ based on the amount of 02 on a molar basis.

In some embodiments, the photoresist 236, anti-reflective coatings 232, 234 and advanced patterning film 230 are removed at the same time as the pattern transfer. In some embodiments, one or more of the photoresist 236, anti-reflective coatings 232, 234 or advanced patterning film 230 remain after pattern transfer and are removed in a separate process.

FIG. 2D illustrates an embodiment of the electronic device 240 after transferring the pattern into the capacitor mold 210 to form electronic device 260 with patterned capacitor mold 262. The patterned capacitor mold 262 in the illustrated embodiment comprises patterned silicon oxide layer 264 and patterned second layer 266.

FIG. 2D shows the electronic device 240 after removing the patterned hard mask oxide 248, patterned ruthenium carbide hard mask 246, patterned optional seed layer 244 and patterned optional hard mask underlayer 242. The patterned hard mask oxide 248, patterned ruthenium carbide hard mask 246, patterned optional seed layer 244 and patterned optional hard mask underlayer 242 can be removed at the same time as the pattern transfer into the capacitor mold 210 or in one or more separate processes. In some embodiments, a plasma comprising an oxygen content and a chlorine content is used to remove the patterned ruthenium carbide hard mask 246, the patterned optional seed layer 244 and the patterned optional hard mask underlayer 242.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising:
depositing a ruthenium carbide hard mask on a capacitor mold formed on a semiconductor substrate;
forming a hard mask oxide on the ruthenium carbide hard mask;
forming a patterned photoresist on the hard mask oxide; and
exposing the semiconductor substrate to an etchant plasma comprising a carbonyl sulfide content, an oxygen content, and a chlorine content to transfer a pattern of the patterned photoresist to the ruthenium carbide hard mask to form a patterned ruthenium carbide hard mask, wherein the chlorine content is less than or equal to 15% of the oxygen content, on a molar basis.

2. The method of claim 1, wherein the ruthenium carbide hard mask comprises in the range of 20 to 45 at. % ruthenium.

3. The method of claim 2, wherein the ruthenium carbide hard mask comprises less than or equal to 15 at. % hydrogen.

4. The method of claim 1, further comprising transferring a pattern of the patterned ruthenium carbide hard mask into the capacitor mold.

5. The method of claim 4, further comprising etching the patterned ruthenium carbide hard mask from the capacitor mold.

6. The method of claim 1, wherein the carbonyl sulfide content is less than or equal to 10% of the oxygen content, on a molar basis.

7. The method of claim 1, wherein the ruthenium carbide hard mask has a thickness in the range of 500 Å to 400 Å.

8. The method of claim 1, further comprising forming one or more of a carbon film or amorphous silicon film on the capacitor mold between the capacitor mold and the ruthenium carbide hard mask.

9. The method of claim 8, wherein the combination of the carbon film, amorphous silicon film and ruthenium carbide hard mask has a thickness in the range of 500 Å to 4000 Å.

10. The method of claim 1, wherein the capacitor mold comprises a silicon oxide (SiO) layer.

11. The method of claim 10, wherein the capacitor mold further comprises a silicon carbon nitride (SiCN) layer or silicon nitride (SiN) layer on the silicon oxide layer.

12. The method of claim 11, wherein the silicon oxide (SiO) layer has a thickness up to 3 μm and the SiCN layer has a thickness up to 1000 Å.

13. A method comprising:
forming a capacitor mold on a semiconductor substrate, the capacitor mold comprises a silicon oxide (SiO) layer and a silicon carbon nitride (SiCN) layer or silicon nitride (SiN) layer on the silicon oxide layer, the silicon oxide (SiO) layer having a thickness in the range of 1 μm to 3 μm and the SiCN layer or SiN layer having a thickness up to 1000 Å;
depositing one or more of an amorphous silicon film or carbon film directly on the capacitor mold;

depositing a ruthenium carbide hard mask on the capacitor mold and on the amorphous silicon film or carbon film, the ruthenium carbide hard mask comprising in the range of 20 to 45 at. % ruthenium and in the range of 5 to 15 at. % hydrogen, the sum of thicknesses of the amorphous silicon film or carbon film and ruthenium carbide hard mask in the range of 2500 to 3500 Å;

forming a hard mask oxide on the ruthenium carbide hard mask;

forming an anti-reflective coating comprising one or more of a dielectric anti-reflective coating (DARC) or bottom anti-reflective coating (BARC) on the hard mask oxide;

forming a photoresist on the anti-reflective coating, the photoresist having a pattern;

transferring the pattern of the photoresist to the anti-reflective coating, the hard mask oxide, and the ruthenium carbide hard mask by exposing the substrate to an etchant plasma comprising an oxygen content, a chlorine content, and a carbonyl sulfide content to form a patterned hard mask oxide, a patterned ruthenium carbide hard mask and remove the anti-reflective coating, the chlorine content in the range of 5% to 15% of the oxygen content, on a molar basis, the carbonyl sulfide content is in the range of 5% to 10% of the oxygen content, on a molar basis;

removing remaining photoresist and anti-reflective coating to leave the patterned hard mask oxide and patterned ruthenium carbide hard mask; and transferring the pattern of the patterned hard mask oxide and patterned ruthenium carbide hard mask into the amorphous silicon film or carbon film.

14. A film stack comprising:

a capacitor mold;

a ruthenium carbide hard mask on the capacitor mold, the ruthenium carbide hard mask having a thickness in the range of 500 Å to 4000 Å and comprising in a range of 20 to 45 at. % ruthenium and less than or equal to 15 at. % hydrogen, with the remainder carbon;

a hard mask oxide on the ruthenium carbide hard mask;

a patterned photoresist on the hard mask oxide; and one or more of a carbon film or amorphous silicon film on the capacitor mold between the capacitor mold and the ruthenium carbide hard mask, and the combination of the carbon film, amorphous silicon film, and ruthenium carbide hard mask has a thickness in the range of 2500 Å to 3500 Å.

\* \* \* \* \*